United States Patent [19]

Smith

[11] Patent Number: 5,686,854
[45] Date of Patent: Nov. 11, 1997

[54] ISOLATED DRIVER CIRCUIT FOR HIGH FREQUENCY SOLID-STATE SWITCHES

[75] Inventor: Gerald L. Smith, Torrance, Calif.

[73] Assignee: Magl Power Inc., Torrance, Calif.

[21] Appl. No.: 615,409

[22] Filed: Mar. 14, 1996

[51] Int. Cl.$^6$ ................................................. H03K 17/04
[52] U.S. Cl. .......................... 327/374; 327/403; 327/442
[58] Field of Search ...................................... 327/108, 374, 327/365, 376, 403, 377, 404, 405, 407, 408, 409, 411, 412, 442

[56] References Cited

U.S. PATENT DOCUMENTS 5,530,385 6/1996 Miettinen .................................. 327/108

Primary Examiner—Timothy P. Callahan
Assistant Examiner—Jeffrey Zweizig
Attorney, Agent, or Firm—Monty Koslover Assoc.

[57] ABSTRACT

A driver circuit for high frequency transistor type switches, comprising two sections; a positive (+) drive and a negative (−) drive, both sections being supplied with a high frequency signal by a square wave oscillator source. The sections are connected in parallel to a control generated input drive signal. In the negative drive section, the input drive signal is first inverted before being processed. Each section contains precise circuits for routing a high frequency carrier signal, for increasing input drive signal power gain, for providing independent positive and negative slope control, for providing exceptionally high voltage and noise isolation to avoid transmission of harmful voltages or noise, and for delivering a positive or negative drive signal to the gate/emitter of an external transistor under drive. The invention is characterized by its high voltage and noise isolation, using few components and being small in size.

6 Claims, 1 Drawing Sheet

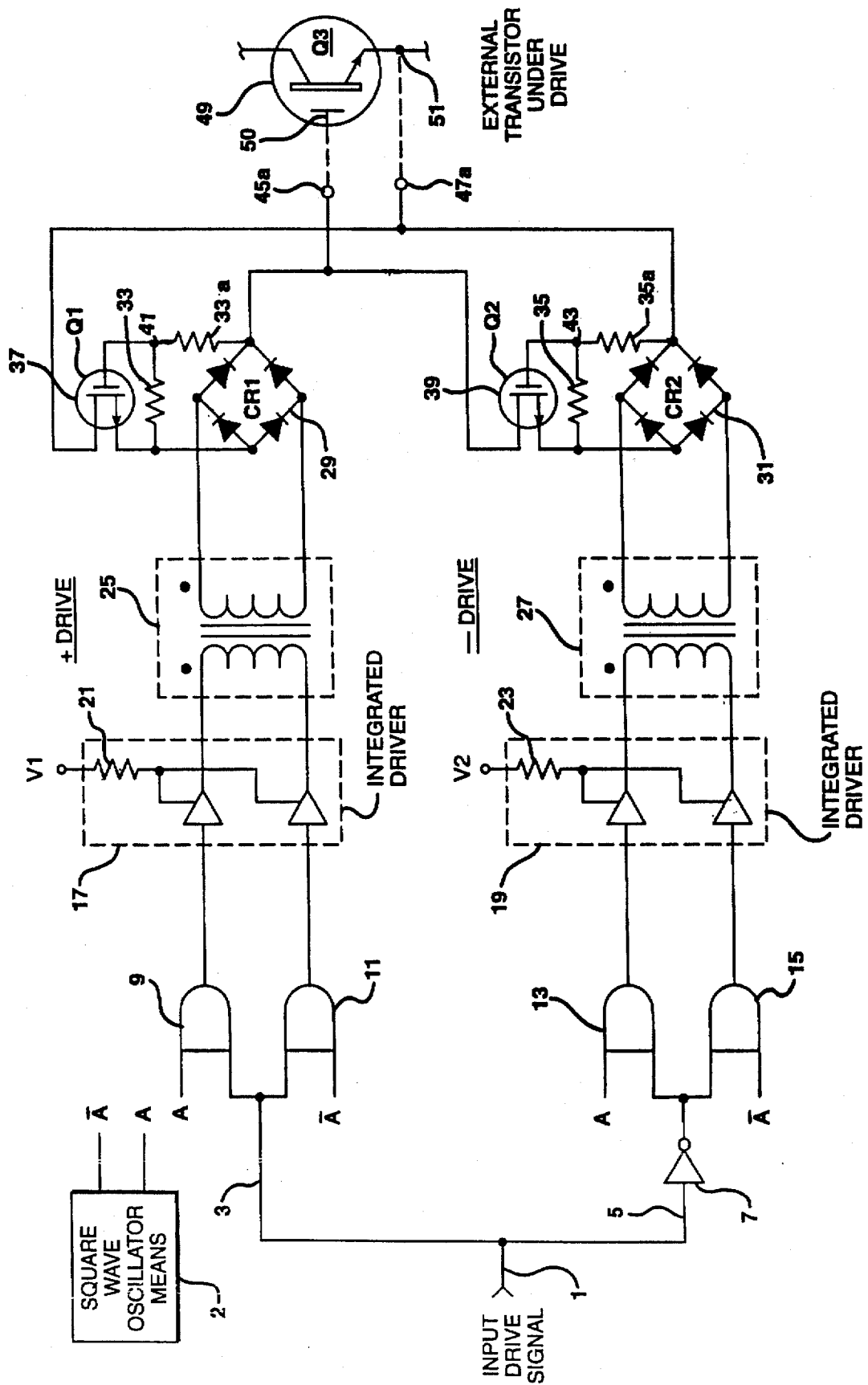

ISOLATED DRIVER CIRCUIT FOR HIGH FREQUENCY SOLID-STATE SWITCHES

BACKGROUND OF THE INVENTION

1. Field of the Invention

The invention relates to driver circuits used to turn on solid-state switches such as transistors of all types by applying drive signals to their gates, and more particularly, to a novel driver circuit that provides voltage and noise isolation for small, high frequency solid-state switches.

2. Prior Art Drive Circuitry

Presently available driver circuits for high frequency transistors include a power supply which is usually supplied by a 115 VAC, 60 Hz source. The power supply typically consists of a step-down isolation transformer, a full wave bridge rectifier connected to the secondary winding of the transformer, a filter capacitor across the output of the bridge rectifier, and a voltage regulator. The remainder of a typical driver circuit will usually include a coupler means such as an opto-coupler with a Faraday shield, and a driver output power circuit. The driver output power circuit serves to amplify the signal transmitted by the opto-coupler and includes cascaded transistors to perform this task.

These driver circuits are used successfully in many applications such as in power converters, frequency changers and amplifiers. However, the present driver circuits have a number of drawbacks and disadvantages which must be compensated for in the power equipment design, often at considerable expense. These drawbacks, limitations and disadvantages are as follows:

1. A large transformer is required for isolation supply of 115 VAC, 60 Hz power, adding weight to the driver.
2. A large filter capacitor is required for the power supply, adding further weight and size to the driver.
3. If the coupler means is an opto-coupler, which is commonly used, high current will be required from the input drive signal, introducing control problems.

An opto-coupler will also limit the operating upper frequency to below 20 KHz, and the high voltage isolation to a low maximum.

4. The driver output cannot swing negative unless an additional isolated power supply is included, restricting the operating mode to the maximum DC voltage. The lack of negative bias will require a large snubber to be provided for the external transistor being driven.
5. The power supply transformer provides undesired common mode coupling to the driver.
6. The driver output power circuit is complex, having a large component count which reduces the reliability of the driver circuit.

There is therefore a need for a driver circuit that can perform adequately without the drawbacks and limitations of the presently available driver circuits.

SUMMARY OF THE INVENTION

The invention comprises two sections, a positive (+) drive and a negative (−) drive, both sections being supplied with a high frequency signal by a square wave oscillator means. The sections are connected in parallel to a control generated input drive signal. Each section contains a multiplexer means which routs the high frequency carrier signal, an integrated driver chip that receives the carrier signal and increases its power gain, also providing positive or negative slope control for the signal, a small ferrite core transformer for isolation and a rectifier/switch circuit for providing a dc drive signal to the gate/emitter of an external transistor. The negative drive section also includes a signal inverter to invert the input drive signal.

Voltage isolation in excess of 5,000 volts and high common mode isolation are provided by a miniature isolation transformer. Independent slope control for signal waveform rise and fall times is provided. The driver circuit can operate at frequencies in excess of 20 KHz while being adaptable for driving high frequency transistors such as field-effect transistors (FET's) and insulated-gate-bipolar transistors (IGBT's). The complete driver circuit is small in size, using no large components, and high in reliability due to a low component count and a simple, low voltage/current stress configuration.

Accordingly, it is a principal object of this invention to provide a driver circuit for solid-state switches that incorporates high common mode isolation and high voltage isolation.

Another object is to provide a driver circuit that is able to operate at very high frequencies.

Yet another object is to provide a driver circuit that is small in size and reliable in operation.

Further objects and advantages of the invention will be apparent from studying the following portion of the specification, the claims and the attached drawings.

BRIEF DESCRIPTION OF THE DRAWINGS

The FIGURE is a simplified schematic diagram of the invention driver circuit, particularly showing drive being applied to an IGBT type transistor as an example of its use.

DESCRIPTION OF THE PREFERRED EMBODIMENT

Referring particularly to the drawings, there is shown in the FIGURE a simplified schematic of the invention driver circuit. The driver circuit is composed of two sections, a positive (+) drive and a negative (−) drive, and a square wave oscillator means 2. Both of the oscillator means 2 output positive going (A) and negative going ($\overline{A}$) wave signals are high frequency signals applied to the inputs of each drive section. An externally generated drive signal is connected to the circuit input terminal 1, and connected in parallel to an input 3 to the (+) drive section and to an input 5 to the (−) drive section.

In the (−) drive section, the incoming drive signal 5 is connected to an inverter 7 which inverts the drive signal.

The (+) drive section comprises a multiplexer means, an integrated driver circuit 17, an isolation transformer 25 and a rectifier/switch circuit. The oscillator means 2 output signals A and $\overline{A}$ are connected input to terminals of a set of AND gates 9 and 11 which function as a multiplexer means. The external drive signal at the section input 3 is also connected input to terminals of the AND gates 9 and 11. Thus, the AND gates 9 and 11 function as a multiplexer means for routing the high frequency oscillator carrier of the input drive signal to the inputs of an integrated driver chip 17.

The integrated driver chip 17 will increase the power gain of the carrier for the excitation of the isolation transformer 25. As part of its function, the driver chip 17 includes a positive slope control resistor 21 that determines the rise time of the gate signal applied to an external transistor Q3 49.

V1 is the voltage source for the (+) drive section and is applied to the integrated driver 17 at its slope control resistor 21 terminal. The voltage source applied at V1, is typically (+) 15 VDC and is taken from a regulated DC power supply. It provides the voltage and current for the driver output.

The isolation transformer 25 is small in size, having only a few turns. The transformer winding ratio can be made 1:1 and the manufacturing cost can be minimized by using a number of turns less than 8, and this is recommended. The transformer 25 core can be toroid in shape, having an overall diameter of about ½ inch. The core material is selected for carrier operating frequency in combination with the required output drive current which will vary, depending on the type and size of external transistor being driven.

The secondary of the isolation transformer 25 is connected to a rectifier/switch circuit comprising a full wave bridge rectifier CR1, 29, a resistor-divider composed of a first resistor 33 and a second resistor 33a in series connection across the bridge rectifier output, and a transistor Q1, 37 connected to a bridge output terminal and the center point 41 of the resistor-divider. The resistor-divider 33–33a, serves to limit the voltage applied to transistor Q1. This allows the voltage input V1 to operate at a high value without damaging transistor Q1. The first resistor 33, which is connected across transistor Q1, serves as a termination during the transistor off state.

When the transformer 25 secondary output signal is applied to the bridge rectifier CR1 input terminals, the voltage developed at the CR1 output is applied to transistor Q1, 37. Transistor Q1 is made to conduct, which connects the output of the bridge rectifier CR1 to the driver circuit output terminals 45a, 47a for application to the gate 50 and emitter 51 of external transistor Q3, 49. One output terminal of bridge rectifier CR1 is connected directly to a gate drive output terminal 45a while the other CR1 output terminal is switched through transistor Q1 and connected to drive output terminal 47a for connection to the emitter of the external transistor Q3.

When the input drive signal is positive, the (+) drive section is connected to the external transistor Q3. The (+) drive section then supplies a signal rise and positive pulse level to the Q3 transistor gate/emitter. The pulse widths are determined by the circuit input drive signal 1.

The (−) drive section operates in the same manner as the (+) drive section to which it is identical, with the exception of the addition of an inverter 7 to the (−) drive section input.

In summary, the (−) drive section comprises an inverter 7, a multiplexer means, an integrated driver circuit 19, an isolation transformer 27 and a rectifier/switch circuit.

The oscillator means 2 output signals A and $\overline{A}$ are connected input to terminals of a set of AND gates 13 and 15 which function as a multiplexer means. The external drive signal at the section input 5 is connected through the inverter 7, which inverts the signal, to terminals of the AND gates 13 and 15. The outputs of the AND gates 13 and 15 are connected to the inputs of an integrated driver chip 19.

The integrated driver chip 19 will increase the power gain of the carrier for the excitation of the isolation transformer 27. As part of its function, the driver chip 19 includes a negative slope control resistor 23 that determines the fall time of the external transistor Q3 49 gate signal.

The voltage source for the (−) drive section is V2 which is applied to the integrated driver 19 at its slope control resistor 23 terminal.

The isolation transformer 27 primary winding is connected to the integrated driver 19 output. The secondary of the isolation transformer 27 is connected to a rectifier/switch circuit comprising a full wave bridge rectifier CR2, 31, a resistor-divider composed of a first resistor 38 and a second resistor 35a in series connection across the bridge rectifier output, and a transistor Q2, 39 which is connected to a bridge output terminal and the center point 43 of the resistor-divider. When sufficient voltage is developed across the first resistor 35, transistor Q2 conducts and connects the CR2 output signal to the driver circuit output terminals 45a, 47a for input to the gate 50 and emitter of the transistor being driven, Q3.

When the input drive signal is negative, the −drive section will be connected to the external transistor Q3. The (−) drive section then supplies a fall signal and negative level to the Q3 transistor gate/emitter. The level widths are determined by the circuit input drive signal 1.

When comparing the outputs of the (+) and (−) drive sections, it is clear that the sections operate alternately, to produce the drive waveforms presented to the gate/emitter terminals of an external driven transistor. Independent slope control for rise and fall times is incorporated in the circuit in the form of resistors 21 and 23 which connect an external DC power supply to the integrated driver chips 21, 23. These slope control resistors can be made adjustable, allowing the slope to be varied.

In reviewing the circuit shown in the FIGURE, it should be noted that, unlike the prior art drivers, the external power supply inputs (V1 and V2) are connected in the circuit only on the primary side of the isolation transformers. Further, there are no external signal inputs on the secondary side of the isolation transformers. Thus, not only is there high voltage isolation in excess of 5,000 volts between the circuit input and output signals, but also high common mode isolation is provided.

There are no particular limits to the operation frequency. This is a matter of design choice. The driver frequency operation will typically be in the order of 20 KHz, which is suitable for FET's and IGBT's.

Regarding the size and reliability of the circuit as embodied on a circuit board, it is clear that its size can be very small. Because of its high frequency, low voltage and current operation, the isolation transformer can be a small toroid shape, ½ inch or less in diameter. The AND gates are on a chip and might be added to the integrated driver chips. The square wave oscillator means is provided in a small circuit. The remaining components of the output power circuits; rectifiers, resistors and transistors are all low power dissipating components and are small in size. Thus, the circuit board can be made very small.

The circuit reliability will be relatively high as compared with the prior art driver circuits, because of the small number of components used and the low voltage and current stress of operation.

To sum up the advantages of the invention as compared with the presently used state of the art drive circuits, the following applies:

The invention driver circuit:
  a) provides very high voltage isolation, >5,000 volts and high common mode isolation;
  b) includes independent slope control (Rise/Fall time);
  c) includes independent voltage selection
  d) can provide a high current drive (e.g. 4 Amp.) if needed;
  e) is small in size, using integrated chips and miniature transformer;
  f) is highly reliable and relatively low cost due to its small number of components;

g) operates at high driver frequencies;

h) provides blow-back protection from fault for control electronics, using the leakage reactance of the isolation transformer;

i) Is a universal configuration for many types of transistor switches including IGBT's and MOS-FET's.

The above characteristics and advantages make the invention driver circuit a significant improvement on the state of the art.

From the foregoing description, it is believed that the preferred embodiment achieves the objects of the present invention. Various modifications and changes may be made in the circuit described above which are apparent to those skilled in the art. These alternatives and modifications are considered to be within the scope of the appended claims and are embraced thereby.

Having described the invention, what is claimed is:

1. A driver circuit for driving the gates of solid-state switches, comprising in combination:

(a) a square wave oscillator means;

(b) an input terminal connected to the output of a control signal drive source;

(c) a positive signal drive circuit comprising a first multiplexer means receiving an input drive signal from said input terminal and receiving a positive going and a negative going signal from said square wave oscillator means; said first multiplexer means producing a high frequency ac carrier wave for said input drive signal to an integrated driver;

a first integrated driver receiving said high frequency ac carrier wave and producing an output signal amplifying said carrier wave; said integrated driver including a first resistor connected to a positive DC voltage source, said first resistor providing positive slope control for said output signal;

a first isolation transformer providing high voltage isolation and common mode isolation between the input portion of said driver circuit and the output of said driver circuit; and a first rectifier/switch circuit including a full-wave rectifier bridge, a second and third resistor connected in series as a voltage divider across the output terminals of said rectifier bridge, and a transistor having a gate connected to the center tap of said voltage divider and a source connected to an output terminal of said rectifier bridge;

said positive signal drive circuit accepting a control signal input from said control signal drive source and accepting a high frequency square wave, positive and negative, from said square wave oscillator means, processing said control signal through said first multiplexer means, through said first integrated driver, through said first isolation transformer and through said first rectifier/switch circuit, producing a positive going gate-to-source signal capable of energizing the gate-to-source terminals of a transistor type solid state switch;

(d) a negative signal drive circuit connected in parallel with said positive signal drive circuit to said input terminal, said negative signal drive circuit comprising a signal inverter receiving an input drive signal from said input terminal and inverting said signal for input to a multiplexer means;

a second multiplexer means receiving an inverted input drive signal from said inverter and receiving a positive going and a negative going signal from said square wave oscillator means; said second multiplexer means producing a high frequency ac carrier wave for said input drive signal to an integrated driver;

a second integrated driver receiving said high frequency ac carrier wave and producing an output signal amplifying said carrier wave; said integrated driver including a fourth resistor connected to a positive DC voltage source, said fourth resistor providing negative slope control for said output signal;

a second isolation transformer providing high voltage isolation and common mode isolation between the input portion of said drive circuit and the output of said drive circuit; and a second rectifier/switch circuit including a full-wave rectifier bridge, a fifth and sixth resistor connected in series as a voltage divider across the output terminals of said rectifier bridge, and a transistor having a gate connected to the center tap of said voltage divider and a source connected to an output terminal of said rectifier bridge;

said negative signal drive circuit accepting a control signal input from said control signal drive source and accepting a high frequency square wave, positive and negative, from said square wave oscillator means, processing said control signal through said inverter and second multiplexer means, through said second integrated driver, through said second isolation transformer and through said second rectifier/switch circuit, producing a negative going gate-to-source signal capable of switching off the gate-to-source terminals of a transistor type solid state switch; and (e) two circuit output terminals connected in parallel to the output terminals of said positive signal drive circuit and to the output terminals of said negative drive circuit.

2. The positive signal drive circuit of claim 1 wherein:

said first multiplexer means includes a first AND gate and a second AND gate; said first AND gate having its inputs connected to the positive square wave output of said oscillator means and to said control signal input; said second AND gate having its inputs connected to the negative square wave output of said oscillator means and to said control signal input.

3. The positive signal drive circuit of claim 1 wherein:

said first isolation transformer is a toroid ferrite core having a small number of turns, typically 8 turns or less and having a low winding to winding capacitance; said transformer achieving voltage isolation in excess of 5,000 volts and reducing coupled noise.

4. The negative signal drive circuit of claim 1 wherein:

said second multiplexer means includes a first AND gate and a second AND gate; said first AND gate having its inputs connected to the positive square wave output of said oscillator means and to the inverted control signal output of said inverter; said second AND gate having its inputs connected to the negative square wave output of said oscillator means and to the inverted control signal output of said inverter.

5. The negative signal drive circuit of claim 1 wherein:

said second isolation transformer is a toroid ferrite core having a small number of turns, typically 8 turns or less and having a low winding to winding capacitance; said transformer achieving voltage isolation in excess of 5,000 volts and reducing coupled noise.

6. The driver circuit according to claim 1 wherein: said first resistor in said positive signal drive circuit and said fourth resistor in said negative signal drive circuit are selected to obtain positive and negative slope control for the driver curcuit output waveform rise and fall times.

* * * * *